(12) United States Patent
Wienand et al.

(10) Patent No.: US 9,606,006 B2
(45) Date of Patent: Mar. 28, 2017

(54) MEASURING SHUNT COMPRISING PROTECTIVE FRAME

(75) Inventors: Karlheinz Wienand, Aschaffenburg (DE); Margit Sander, Karlstein (DE)

(73) Assignee: Heraeus Sensor Technology GmbH, Hanau (DE)

( * ) Notice: Subject to any disclaimer, the term of this patent is extended or adjusted under 35 U.S.C. 154(b) by 587 days.

(21) Appl. No.: 14/232,422

(22) PCT Filed: Jun. 27, 2012

(86) PCT No.: PCT/EP2012/002706
§ 371 (c)(1),
(2), (4) Date: Jan. 13, 2014

(87) PCT Pub. No.: WO2013/007343
PCT Pub. Date: Jan. 17, 2013

(65) Prior Publication Data
US 2014/0153613 A1 Jun. 5, 2014

(30) Foreign Application Priority Data

Jul. 14, 2011 (DE) .................. 10 2011 051 845

(51) Int. Cl.
*G01K 1/08* (2006.01)
*G01K 7/18* (2006.01)
(Continued)

(52) U.S. Cl.
CPC ............... *G01K 7/18* (2013.01); *C23C 14/18* (2013.01); *C23C 16/06* (2013.01)

(58) Field of Classification Search
None
See application file for complete search history.

(56) References Cited

U.S. PATENT DOCUMENTS

| 4,050,052 A | 9/1977 | Reichelt et al. |
| 4,791,398 A | 12/1988 | Sittler et al. |

(Continued)

FOREIGN PATENT DOCUMENTS

| DE | 2527739 A1 | 12/1976 |
| DE | 102007046900 A1 | 4/2009 |

(Continued)

OTHER PUBLICATIONS

Int'l Preliminary Report on Patentability issued Jan. 23, 2014 in Int'l Application No. PCT/EP2012/002706.

(Continued)

*Primary Examiner* — Erica Lin
(74) *Attorney, Agent, or Firm* — Panitch Schwarze Belisario & Nadel LLP

(57) ABSTRACT

A high temperature sensor includes a substrate, at least two terminal contacts and at least one resistive structure, wherein the terminal contacts and the at least one resistive structure are disposed on a first side of the substrate, and at least one of the resistive structures is electrically contacted by the terminal contacts, wherein at least one electrode is disposed on each of the two terminal contacts next to the resistive structure on the first side of the substrate. The electrodes are electrically connected to the terminal contacts, respectively, or at least one electrode is disposed on at least one terminal contact next to the resistive structure on the first side of the substrate, wherein the electrode is designed in one piece with the resistive structure. The invention also relates to a high temperature sensor and a method for producing such a sensor.

16 Claims, 4 Drawing Sheets

(51) Int. Cl.
*C23C 14/18* (2006.01)
*C23C 16/06* (2006.01)

(56) References Cited

U.S. PATENT DOCUMENTS

| | | | |
|---|---|---|---|
| 5,332,991 | A | 7/1994 | Kojima et al. |
| 5,430,428 | A | 7/1995 | Gerblinger et al. |
| 6,353,381 | B1 | 3/2002 | Dietmann et al. |
| 2002/0084885 | A1 | 7/2002 | Wienand et al. |
| 2005/0200448 | A1* | 9/2005 | Fujita ............ H01C 7/008 338/25 |
| 2009/0115567 | A1* | 5/2009 | Wienand ............ G01K 1/10 338/25 |

FOREIGN PATENT DOCUMENTS

| | | |
|---|---|---|
| EP | 0437325 A2 | 7/1991 |
| EP | 0327535 B1 | 9/1991 |
| EP | 0543413 A1 | 5/1993 |
| EP | 0973020 A1 | 1/2000 |
| JP | S57-114830 A | 7/1982 |
| JP | 2005-292120 A | 4/2007 |
| JP | 2009-085952 A | 4/2009 |
| WO | 9215101 A1 | 9/1992 |

OTHER PUBLICATIONS

Int'l Search Report and Written Opinion issued Oct. 11, 2013 in Int'l Application No. PCT/EP2012/002706.
Office Action issued Apr. 3, 2012 in DE Application No. 10 2011 051 845.2.
Office Action issued Apr. 24, 2015 in CN Application No. 201280035006.1.
Office Action issued May 8, 2015 in KR Application No. 10-2014-7002962.

* cited by examiner

MEASURING SHUNT COMPRISING PROTECTIVE FRAME

CROSS-REFERENCE TO RELATED APPLICATIONS

This application is a Section 371 of International Application No. PCT/EP2012/002706, filed Jun. 27, 2012, which was published in the German language on Jan. 17, 2013, under International Publication No. WO 2013/007343 A2 and the disclosure of which is incorporated herein by reference.

BACKGROUND OF THE INVENTION

The invention relates to a temperature sensor, in particular a high temperature sensor, comprising a substrate, at least two terminal contacts and at least one resistive structure, wherein the terminal contacts and at least one of the resistive structures are disposed on a first side of the substrate, and wherein at least one resistive structure is electrically contacted by the terminal contacts.

The invention also relates to a method for producing such a temperature sensor, in which at least one resistive structure is applied to a first side of a substrate, and to a high temperature sensor comprising such a temperature sensor.

A temperature sensor made of metal of the platinum group is known from WO 92/15101 A1, comprising a platinum resistive layer applied to a ceramic substrate and a passivation layer applied thereon.

U.S. Pat. No. 5,202,665 A discloses a method for producing a temperature sensor, wherein a platinum layer is applied to a substrate using the thick-film technique. Platinum powder is mixed with oxides and binders for this purpose and applied by way of screen printing.

Moreover, an electrical measuring resistor structure for resistance thermometers and a method for producing such an electrical measuring resistor structure are known from U.S. Pat. No. 4,050,052 A or DE 25 27 739 C3.

JP 57114830 A discloses a temperature sensor, in which a measuring electrode for determining the temperature on a substrate is surrounded by a second electrode so as to determine the humidity by a resistance measurement of the surface of the substrate between the electrodes.

A similar construction is proposed in EP 0 437 325 A2, in which the surface resistance or the internal resistance of the substrate is determined with the aid of two additional electrodes, which are disposed next to a resistive layer on the substrate or on the other side of the substrate.

To produce such a temperature-dependent resistor as a temperature sensor, the Pt resistive layer is applied as a thick film in meander-shaped form onto a substrate having a surface made of electrically insulating material, wherein the outer surface of the resistive layer is covered by a layer made of electrically insulating material, which serves as a passivation layer. The problem with such sensors is that metallic ions can migrate into the resistive layer and damage, or even destroy, the same, in particular at high temperatures. This causes the properties of the temperature sensor to be changed.

A method for producing a temperature-dependent resistor comprising platinum as a temperature sensor is known from EP 0 543 413 A1, wherein an electrode is applied at a distance from the resistive layer. This is intended to prevent ion migration to the resistive layer caused by current conduction. The electrode is electrically conductively connected to the resistive layer for this purpose.

EP 0 327 535 B1 discloses a temperature sensor having a thin-film platinum resistor as a measuring element. A temperature measuring resistor made of platinum is disposed on a surface of an electrically insulating substrate, wherein the resistance element is covered by a dielectric protective layer, which is preferably made of silicon dioxide and has a thickness ranging from 200 to 400 nm. Moreover, a diffusion barrier layer is provided as the topcoat, which is applied by the deposition of titanium in an oxygen atmosphere so as to form titanium oxide. This barrier layer has a thickness ranging from 600 to 1200 nm. While the diffusion barrier layer allows access of oxygen to the dielectric layer, and thereby partially prevents an attack of freed metal ions diffused out of the glass layer on the platinum layer, under extreme ambient conditions an attack on the platinum layer may nonetheless take place, so that they physical behavior thereof as a temperature sensing element is impaired.

According to EP 0 973 020 A1, such temperature sensors may be fitted with a sacrificial cathode and withstand temperatures of up to 1100° C. This technique protects the measuring shunt from chemical or mechanical attacks. However, it must always be assure in this sensor that the cathode is properly electrical connected, because a mixup of the electrical connections results in destruction of the sensor. In addition, the sensor is subject to drift at temperatures starting at 700° C.

A temperature sensor having a Pt resistance film is known from DE 10 2007 046 900 A1, the layer being covered by a thin film made of aluminum oxide. A cover is glued onto the ceramic film covering the resistance film. A glass ceramic which is doped with metal and which is electrically conductively connected to one of the terminal surfaces of the temperature sensor forms a sacrificial cathode to protect the resistance layer from harmful influences of metal cations, and to thereby reduce the aging process of the temperature sensor or prevent the temperature sensor from being destroyed. The influence of the power supply connection and polarity of the housing in which the sensor is installed may cause the sensor to drift.

The drawback of all these temperature sensors is that the temperature sensors have a complex design comprising several layers, some of which are complex. Due to the complex design, the production requires many work steps, whereby the costs for production of such a temperature sensor are high.

Another considerable drawback is that the polarity must be observed during installation or use of the temperature sensor because otherwise the temperature measurement may worsen or the temperature sensor may be unfit for use, or the temperature sensor may even be destroyed the first time it is operated.

BRIEF SUMMARY OF THE INVENTION

It is the object of the invention to overcome the drawbacks of the prior art. In particular, a simple design that can be implemented cost-effectively is to be found, which can also be carried out easily in mass production.

Another object of the present invention is further to provide a sensor, the drift of which is reduced in the application range of 750° C. to 1200° C. and which is not sensitive with regard to the polarity of the power supply connection and the housing.

The object of the invention is achieved by disposing at least one electrode on each of the two terminal contacts next to the resistive structure on the first side of the substrate, the electrode being electrically connected to the respective terminal contact.

With this design, it is achieved that the polarity of the temperature sensor need not be observed during installation to maintain the functionality of the electrode as a sacrificial electrode.

It may be provided that the electrodes are designed in one piece with the resistive structure.

In this way, a particularly simple and compact design of the temperature sensor can be implemented. The design may be carried out in one work step and is cost-effective.

The object of the invention is also achieved by disposing at least one electrode on at least one terminal contact next to the resistive structure on the first side of the substrate, wherein the electrode is, or the electrodes are, designed in one piece with the resistive structure.

A particularly simple and compact design of the temperature sensor can also be implemented in this way. The design may be carried out in one work step and is cost-effective.

This is essential for the functionality of the electrode as a sacrificial cathode.

It may be provided for this purpose that the terminal contact, to which the at least one electrode is connected, is a cathode.

It may be provided according to the invention in all embodiments that the electrode frames, or the electrodes frame, the resistive structure at least in some regions, in particular that at least one side is framed by an electrode, preferably at least two sides of the resistive structure are framed by at least two electrodes, and particularly preferably two opposing sides of the resistive structure.

The framing of the resistive structure by the electrode or electrodes produces particularly good protection for the resistive structure.

It may further be provided that the substrate is a metal oxide, wherein the metal oxide is preferably coated.

Metal oxides are particularly suited as substrates. In particular $Al_2O_3$ is particularly suited as a substrate.

A particularly advantageous embodiment of the invention is achieved when it is provided that the resistive structure has a meander-shaped linear structure, which is preferably made of a metal, particularly preferably platinum.

The meander shape of the resistive layer allows a compact design to be implemented. Platinum is particularly suited at high temperatures and in chemically corrosive environments.

According to a further embodiment of the invention, at least the resistive structure is covered by a dielectric layer, preferably by at least one ceramic layer, a glass layer or a glass-ceramic layer, wherein the dielectric layer is preferably self-supporting.

The covering results in significant improvement of the durability of the temperature sensor or of temperature sensor chips composed thereof. The planar, laterally disposed electrodes are particularly effective with such a design, notably when the electrodes at least partially frame the resistive layers.

The object of the invention is also achieved by a method for producing such a temperature sensor, in which at least one resistive structure is applied to a first side of a substrate, wherein a coating, preferably a metallic coating, is applied to the substrate in such a way that the coating forms the at least one resistive structure, at least two terminal contacts and at least one electrode, so that the terminal contacts electrically contact the at least one resistive structure and electrically contact at least one electrode with at least one terminal contact.

The production method can be carried out in a particularly simple and cost-effective manner.

The object of the invention is further achieved by a high temperature sensor chip comprising such a temperature sensor.

It may be provided that the terminal contacts of the temperature sensor are contacted with wires.

It may further be provided that at least the resistive structure is covered directly and over the entire surface area with a ceramic intermediate layer and/or a glass ceramic and/or a glass layer.

These layers offer protection from mechanical and chemical influences on the high temperature sensor chip.

A cover is preferably disposed on the ceramic intermediate layer. An electric temperature sensor comprising a resistive layer, which is disposed as a measuring shunt provided with electric terminals on an electrically insulating surface of a carrier designed as a ceramic substrate, wherein the resistive layer is covered by at least one layer made of electrically insulating material as protection against contamination or damage, this layer being designed as a passivation layer and/or as a diffusion barrier, is protected according to the invention by a cover so as to withstand temperatures of more than 1000° C.

In particular a glass ceramic or a ceramic cover comprising glass ceramic is glued to the ceramic layer covering the resistive layer.

A ceramic layer covering the resistive layer is located on the side of the resistive layer facing away from the substrate surface.

The substrate is preferably made of a metal oxide, in particular sapphire or a ceramic material.

It is also possible to apply ceramic powder to the resistive layer using a thick-film method and to then sinter the powder so as to form a diffusion barrier or a passivation layer. The advantage is that this method is very cost-effective.

It is further possible to apply ceramic powder to the resistive layer of a fired substrate using a plasma spray method so as to form the diffusion barrier or the passivation layer. This has the advantage that the resulting layer maintains the stability thereof even under high temperatures that occur later during use because of the deposition temperatures.

The diffusion barrier or the passivation layer may additionally be applied using thin-film methods by way of PVD (physical vapor deposition), IAD (ion-assisted deposition), IBAD (ion beam-assisted deposition), PIAD (plasma ion-assisted deposition) or CVD (chemical vapor deposition) or magnetron sputtering methods.

The invention is based on the surprising finding that such a simple design suffices to considerably reduce the negative effects of metal ions on the resistive layer. It was found for the first time that the ions, which are particularly mobile at high temperatures, can be intercepted by an electrode located in the same level as the resistive layer serving as a sacrificial cathode. It is thus already sufficient to provide a simple electrode as a sacrificial cathode, which is disposed next to the resistive layer. In this way, particularly simple production of the temperature sensor may be used by applying the resistive layer together with the electrode or electrodes acting as the sacrificial cathode, and optionally also together with the terminal contacts, as one structure onto a substrate. According to the invention, a single work step is thus sufficient to generate the resistive structure, all the electrodes and optionally also the terminal contacts on the substrate. This increases the speed during production, and considerably reduces the manufacturing costs. According to the invention, the resistive structure is thus shielded from external electrochemical influences to achieve the object.

A further surprising finding of the present invention is that the polarity with which the terminal contacts are electrically connected does not matter when two electrodes are attached to different terminal contacts. One of the two electrodes will always be switched as the cathode and thus fulfill the function thereof as an ion getter, which is to say as a sacrificial cathode to protect the resistive layer. The ions are so mobile, especially at high temperatures, that they migrate in very high numbers to the sacrificial cathode even if they have to diffuse around the resistive layer to do so. So as to achieve better protection of the resistive layer from ions, it may be provided according to the invention that the electrodes extend around the resistive layer. The electrodes may also extend around the resistive layer so far that they both frame the same sides of the resistive layer. One electrode is then an inner electrode, which is disposed more closely on the outside around the resistive layer, and the other electrode is then the outer electrode, which is disposed on the outside around the inner electrode.

To produce high temperature sensors, in which a respective resistive structure is applied in one plane onto a metal-oxide substrate, according to the invention terminal contacts and electrodes originating from the terminal contacts and partially framing the resistive structures are jointly structured with the resistive layers.

According to the invention, the protective electrodes may thus be produced in one method step together with the resistive structures and the terminal contacts. This is particularly favorable for mass production.

According to the invention, a high temperature sensor chip is also provided, comprising terminal contacts and a layer which adjoins the contacts and is structured as a resistor on a metal-oxide substrate, preferably made of magnesium titanate, aluminum oxide, zirconia toughened alumina (ZTA), spinel or similar materials, wherein according to the invention the resistive structure is part of an electrical conductor structure disposed in one plane, and a cathode originating from a terminal contact at least partially frames the resistive structure in this plane.

The at least partially framing cathode protects the resistive structure from being electrochemically compromised and, in particular when it is additionally provided with a ceramic thin film or thick film, has less drift in the temperature-resistance characteristic than previously known temperature sensors, especially at higher temperatures.

In one embodiment comprising two partially framing electrodes, which are electrically connected to two different terminal contacts, the polarity of the component is no longer significant, so that the complexity during installation of the temperature sensor, or of the chip carrying the temperature sensor, and the risk to damage or destroy the temperature in the event of faulty installation, are considerably reduced.

The measuring shunt may preferably be a resistive layer comprising platinum, and more particularly it may be implemented using a thin or thick film technique. The diffusion barrier may be designed in the form of an intermediate layer. It has been found to be advantageous to have cost-effective production and a high service life of the temperature-dependent resistor.

In one practical embodiment, the thickness of the intermediate layer ranges from 0.2 μm to 50 μm.

In a preferred embodiment according to the invention, the carrier is made of $Al_2O_3$. In addition, the diffusion barrier or the intermediate layer is also preferably made of $Al_2O_3$, $HfO_2$ or a mixture of the two materials, wherein the weight fraction of $Al_2O_3$ is in the range of 20% to 70%.

It is also possible for the diffusion barrier or intermediate layer to be composed of a layer system comprising a layer sequence having at least two layers, each being formed of at least one oxide from the group consisting of $Al_2O_3$, MgO, $HfO_2$, and $Ta_2O_5$; to this end, at least one layer may be formed of two of these oxides, wherein preferably a physical mixture of oxides is employed; however, it is also possible to use mixed oxides.

In a further embodiment of the invention, the group consisting of $Al_2O_3$, MgO, and $Ta_2O_5$ may be expanded to include hafnium oxide.

The diffusion barrier or the passivation layer is preferably made of a single-layer system according to Table 1 comprising the materials indicated in positions 1 to 6, or of a multi-layer system according to Table 2 comprising at least two layers 1 and 2, wherein a further layer or further layers may adjoin layer 2. The different layer materials are denoted in the individual positions or lines by numbers 7 to 30.

TABLE 1

Single-layer system

| | |
|---|---|
| 1 | only $Al_2O_3$ |
| 2 | only MgO |
| 3 | only $Ta_2O_5$ |
| 4 | mixture of $Al_2O_3$/MgO |
| 5 | mixture of $Al_2O_3$/$Ta_2O_5$ |
| 6 | mixture of MgO/$Ta_2O_5$ |

TABLE 2

Multi-layer system

| | Layer 1 | Layer 2 |
|---|---|---|
| 7 | only $Al_2O_3$ | only $Al_2O_3$ |
| 8 | only $Al_2O_3$ | only MgO |
| 9 | only MgO | only MgO |
| 10 | only $Ta_2O_5$ | only $Ta_2O_5$ |
| 11 | only $Ta_2O_5$ | only $Al_2O_3$ |
| 12 | only $Ta_2O_5$ | only MgO |
| 13 | mixture of $Al_2O_3$/MgO | only $Al_2O_3$ |
| 14 | only $Al_2O_3$ | mixture of $Al_2O_3$/MgO |
| 15 | mixture of $Al_2O_3$/MgO | mixture of $Al_2O_3$/MgO |
| 16 | mixture of $Ta_2O_5$/MgO | only $Al_2O_3$ |
| 17 | only $Ta_2O_5$ | mixture of $Al_2O_3$/MgO |
| 18 | mixture of $Ta_2O_5$/MgO | mixture of $Al_2O_3$/MgO |
| 19 | mixture of $Al_2O_3$/$Ta_2O_5$ | only $Al_2O_3$ |
| 20 | only $Al_2O_3$ | mixture of $Ta_2O_5$/MgO |
| 21 | mixture of $Al_2O_3$/MgO | only $Ta_2O_5$ |
| 22 | only $Ta_2O_5$ | mixture of $Al_2O_3$/$Ta_2O_5$ |
| 23 | only $Al_2O_3$ | mixture of $Al_2O_3$/$Ta_2O_5$ |
| 24 | mixture of $Al_2O_3$/MgO | mixture of $Ta_2O_5$/MgO |
| 25 | mixture of $Ta_2O_5$/MgO | mixture of $Ta_2O_5$/MgO |
| 26 | mixture of $Al_2O_3$/$Ta_2O_5$ | only $Ta_2O_5$ |
| 27 | only MgO | mixture of $Al_2O_3$/MgO |
| 28 | only MgO | mixture of $Al_2O_3$/$Ta_2O_5$ |
| 29 | mixture of $Al_2O_3$/MgO | only MgO |
| 30 | mixture of $Al_2O_3$/$Ta_2O_5$ | only MgO |

According to the invention, the passivation layer according to the two embodiments may further comprise a mixture of $SiO_2$, BaO and $Al_2O_3$, wherein the weight fraction of $SiO_2$ is in the range of 20% to 50%.

It has been found to be advantageous that this mixture has high insulation resistance.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

Exemplary embodiments of the invention will be described hereafter based on four schematically illustrated figures, however without thereby limiting the invention. In the drawings.

DETAILED DESCRIPTION OF THE INVENTION

Figure 1:
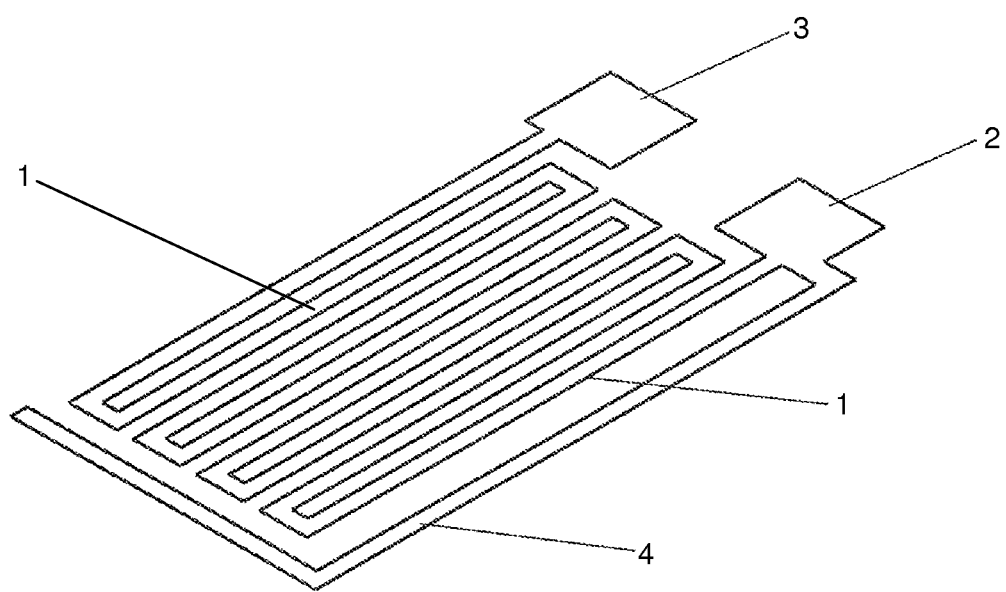
FIG. 1 shows a schematic view of an electrical conductor structure comprising a cathode, which partially frames a resistive structure.

FIG. 1 shows a schematic perspective view of a temperature sensor, which may be applied in this way onto a substrate (not shown) as a thin film. The temperature sensor comprises a resistive structure 1, which is connected at both ends to two terminal contacts 2, 3. The resistive structure 1 extends between the terminal contacts 2, 3 in meanders as a flat ribbon. An electrode 4 is connected as the sacrificial electrode to the cathode 2 of the terminal contacts 2, 3.

The electrode 4 shown in FIG. 1 protects the resistive structure 1, in particular a platinum resistor, from laterally penetrating electrochemical impurities, which would change the resistance value of the resistive structure 1, resulting in interfering drift or even in destruction of the resistive structure 1. The electrochemical impurities, for example metal ions, which diffuse through a component, such as a high temperature sensor chip comprising such a temperature sensor, attack the metal of the resistive structure and dissolve the resistive structure 1 at the edge. This changes the cross-section of the resistive structure 1, and thus the electrical resistance thereof. Due to the negative charge by the cathode 2, the electrode 4 likewise forms a cathode, so that positively charged metal ions are attracted by the electrode 4 and attack (poison) the electrode 4, and not the resistive structure 1.

The resistive structure 1 is structured together with the terminal contacts 2, 3 and the electrode 4 in one method step. For this purpose, the entire structure 1, 2, 3, 4 shown in FIG. 1 (the temperature sensor shown in FIG. 1) is generated on a substrate using a coating method. The simple production process to do so is optimal for mass production and is associated with minimized material usage, in particular when applying thin film technique, which according to the invention is particularly preferred because of the measuring accuracy and miniaturization that can be achieved. In this respect, according to the invention preferably photolithographic structuring of a thin platinum film has been successfully employed.

The electrode 4 frames the resistive structure 1 over two sides. The side of the resistive structure 1 which is connected to the cathode 2, which is to say which has the strongest negative charge during a temperature measurement, is protected particularly well by the electrode 4. Diffusing positively charged metal ions are attracted by the electrode 4 and absorbed there. This attraction, as was surprisingly found, is so strong, notably at high temperatures, that even the metal ions that are present on the side of the resistive structure 1 not framed by the electrode 4, or that are present from above or beneath, migrate toward the electrode 4 and are absorbed there. As a result, such a simple structure, which is a single layer produced with simple thick or thin film technique, is also sufficient to achieve the desired effect.

Figure 2:
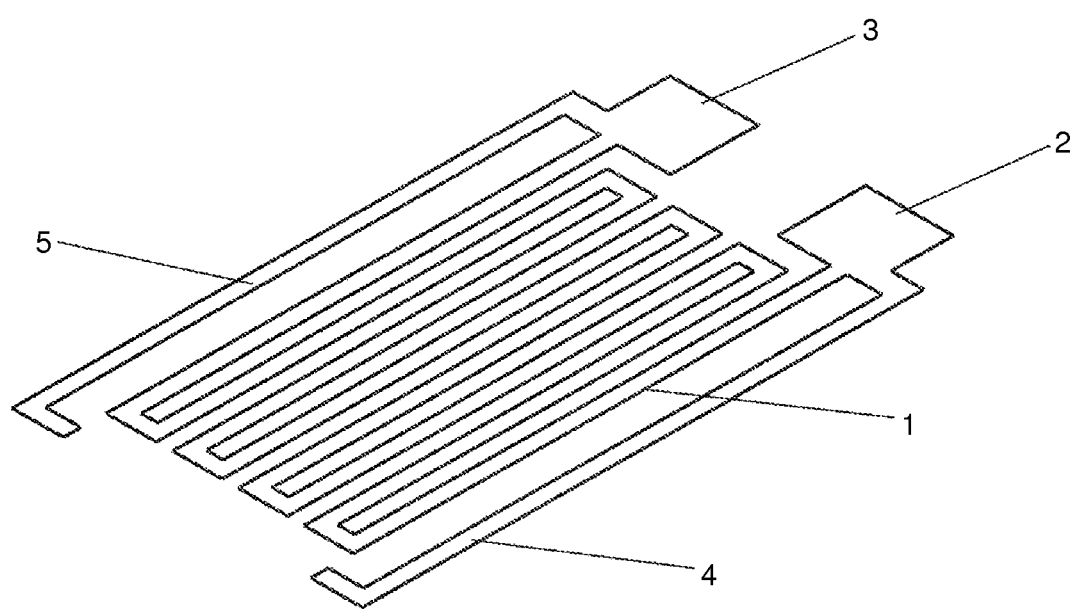
FIG. 2 shows a schematic view of an electrical conductor structure comprising a resistive structure that is partially framed by two electrodes.

FIG. 2 shows a schematic perspective view of an alternative temperature sensor according to the invention. The temperature sensor may be applied in the present form onto a dielectric substrate (not shown). Contrary to the temperature sensor shown in FIG. 1, the one according to FIG. 2 comprises two electrodes 4, 5, wherein each is connected to one of the terminal contacts 2, 3.

One of the electrodes 4, 5 shown in FIG. 2 becomes the cathode after the electrical connection has been made, this cathode protecting the resistive structure 1 provided as the measuring shunt from penetrating electrochemical impurities. This simplifies the installation of the temperature sensor because incorrect connection (polarity reversal) is no longer possible. The drift is thus drastically reduced independently of the electrical connections. It is particularly essential in this embodiment that the polarity and the potential of the housing are also arbitrary.

Contrary to the prior art, in this embodiment the polarity and potential of the housing are thus arbitrary. This saves considerable effort when installing a chip comprising the resistive structure 1 into the sensor housing.

Analogously to FIG. 1 and the advantages described there, the resistive structure 1 is structured together with the terminal contacts 2, 3 and the electrodes 4 and 5 in one method step. The electrodes 4 and 5 each frame one side of the resistive structure 1, the sides being disposed opposite each other. The electrodes 4, 5 additionally extend around a corner onto a common third side of the resistive structure 1. In this way the first turn of the meander-shaped resistive structure 1 is surrounded by the electrodes 4, 5 and protected particularly well.

According to the invention, it may also be provided particularly advantageously that the electrodes 4, 5 extend between the meanders, primarily the first meanders.

Figure 3:
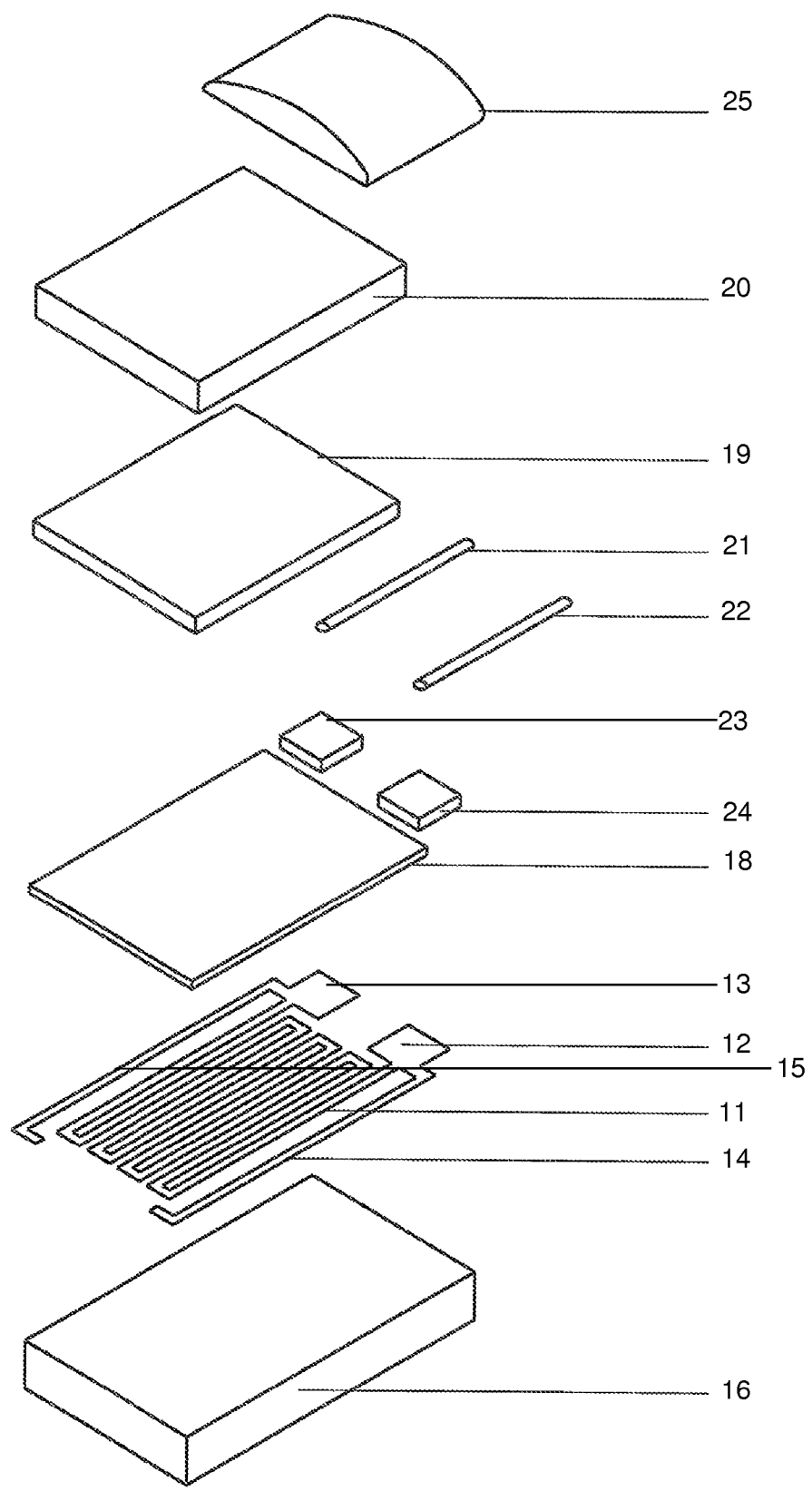
FIG. 3 shows a schematic exploded view of a measuring shunt according to the invention comprising terminal contacts on a substrate.
Figure 4:
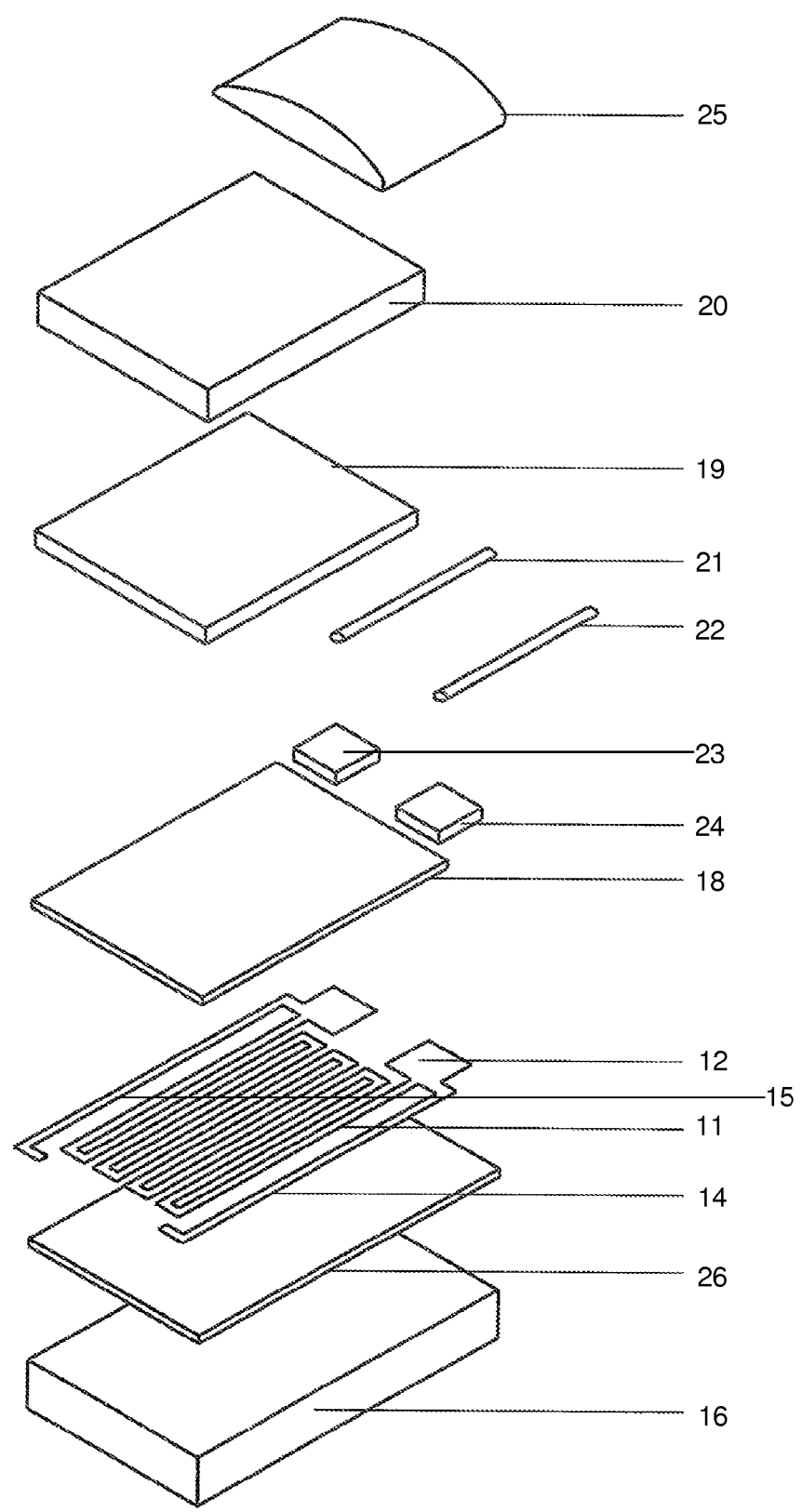
FIG. 4 shows a schematic exploded view of an alternative measuring shunt according to the invention comprising terminal contacts on a substrate.

FIGS. 3 and 4 show schematic exploded views of a measuring shunt according to the invention. A meander-shaped resistive structure 11 is electrically connected to two terminal contacts 12, 13. Analogously to what is shown in FIG. 2, the resistive structure 11 is framed by two electrodes on slightly more than two sides. These electrodes 14, 15 are connected to the two terminal contacts 12, 13 and serve as sacrificial electrodes to protect the resistive structure 11. The resistive structure 11, the terminal contacts 12, 13 and the electrodes 14, 15 are applied onto a substrate 16 as a one-piece structure. The structure is produced in one work step, for example by way of a photolithographic method. The entire structure may thus be disposed on a flat surface of a sapphire or ceramic substrate 16, for example as a thin film. The terminal contacts 12, 13 are made of the same material as the resistive structure 11 and the electrodes 14, 15. The material used is preferably platinum or a platinum alloy.

According to FIGS. 3 and 4, the side of the resistive structure 11 facing away from the substrate 16 is provided with a diffusion barrier layer 18 as an intermediate layer, which in turn is covered by a passivation layer 19 made of glass or glass ceramic and a cover 20.

Because of the cover 20, the sensitive structure of the resistive structure 11 comprising platinum is effectively protected from atmospheric poisoning from the environment. In such a multi-layer design, the cations, which are particularly harmful for the resistive structure 11, are avoided with a high purity of the ceramic and glass components of the glass ceramic 19, which would contaminate platinum very rapidly at high temperatures due to migration in the electric field, and would thus drastically influence the temperature/resistance function of the resulting platinum alloy, so that the high-temperature resistance of the resistive structure 11 would no longer be assured for temperature measurements. Because of the first thermodynamically stable and pure hafnium or aluminum oxide layer as the intermediate layer or diffusion barrier 18, the entering of silicon and other substances or ions poisoning the platinum is decisively minimized. In this way, the resistive structure 11 structured in meander shape, for example, is protected from poisoning not only from the substrate side, but also from the opposing side. The intermediate layer or diffusion barrier 18 may be applied by way of physical vapor deposition.

The aluminum oxide layer 18 is preferably applied hyperstoichiometrically in such a way that a very stable layer made of pure aluminum oxide ($Al_2O_3$) covers the platinum structure of the resistive structure 11. The passivation layer 19 comprising silicon and made of glass ceramic is thus given only minimal contact with the active platinum resistive structure 11, whereby sealing of the resistive structure 11 as mechanical protection with respect to external contaminating elements is assured.

According to FIG. 3, a small ceramic plate 20 is applied to the glass ceramic 19. The small ceramic plate 20 represents additional passivation and acts as a mechanical "protective shield" against abrasion by particles in the housing into which the actual temperature sensor is inserted. This provides protection from mechanical abrasion and electrochemical impurities.

In one embodiment according to FIG. 3 or 4, the terminal contacts 12, 13 are strain-relieved with connecting wires 21 and 22 via connection pads 23 and 24 with an electrically insulating fixing drop 25. This fixation 25 is made of high-purity glass or glass ceramic.

In addition to the embodiment of the intermediate layer as the diffusion barrier 18 set out above, it shall be noted that this layer is applied either using a thin-film method in a thickness ranging from 0.2 to 10 µm, preferably 5 µm, or using a thick-film method in a thickness ranging from 5 to 50 µm, preferably 15 µm.

The thickness of the terminal contact pads 23, 24 on the resistive structure 11 ranges from 10 to 50 µm, and preferably is 20 µm. The substrate 16 as the carrier has a thickness in the range of 0.1 mm to 1 mm, preferably 0.4 mm, and particularly preferably 0.38 mm.

The terminal contacts 2, 3, 12, 13, shown the figures are each disposed on one side; however, it is also possible to employ embodiments of a temperature-dependent resistor, or temperature sensor, preferably high temperature sensor, according to the invention, in which both terminal contacts 2, 3, 12, 13 are located on mutually opposing sides.

As can be seen in FIG. 3, the application of the $Al_2O_3$ thin film 18 is followed by the application of the glass ceramic 19, and then by the application of terminal pads 23, 24 as thick films, and subsequently the ceramic cover 20. Thereafter, the connecting wires 21, 22 are connected, and a fixation 25 is applied for strain relief of the connecting wires 21, 22.

According to FIG. 4, the substrate 16 comprises an intermediate layer 26, in particular a thin film 26 made of aluminum oxide or hafnium oxide beneath the resistive structure 11. The resistive structure 11 serving as the measuring shunt is located on this intermediate layer 26 of the substrate 16, for example in the form of a thin film on a planar surface of this intermediate layer 26.

This intermediate layer 26 is preferably made of aluminum oxide and protects the resistive structure 11. The intermediate layer 26 is thus a coating of the substrate 16, or the substrate 16 is coated with the intermediate layer 26.

The characteristics of the invention disclosed in the above description, as well as in the claims, figures and exemplary embodiments may be essential for the implementation of the invention in its various embodiments either alone or in any arbitrary combination with each other.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A temperature sensor comprising a substrate, at least two terminal contacts and one or more resistive structures, the terminal contacts and the one or more resistive structures being disposed on a first side of the substrate, and at least one of the one or more resistive structures being directly electrically contacted by the terminal contacts, wherein a plurality of electrodes are disposed on the first side of the substrate next to the at least one of the one or more resistive structures, each of the respective terminal contacts being electrically connected to at least one of the plurality of electrodes.

2. The temperature sensor according to claim 1, wherein the electrodes are designed in one piece with the at least one of the one or more resistive structures.

3. A temperature sensor comprising a substrate, at least two terminal contacts and one or more resistive structures, the terminal contacts and the one or more resistive structures being disposed on a first side of the substrate, and at least one of the one or more resistive structures being directly electrically contacted by the terminal contacts, wherein at least one electrode is disposed on the first side of the substrate next to the at least one of the one or more resistive structures, the electrode or the electrodes being electrically connected to at least one of the terminal contacts and designed in one piece with the at least one of the one or more resistive structures (1, 11).

4. The temperature sensor according to claim 3, wherein the terminal contact, to which the at least one electrode is connected, is a cathode.

5. A temperature sensor according to claim 1, wherein at least one electrode frames at least one side of the at least one of the one or more resistive structures.

6. A temperature sensor according to claim 5, wherein at least two sides of the at least one of the one or more resistive structures are framed by at least two electrodes.

7. A temperature sensor according to claim 6, wherein two opposing sides of the at least one of the one or more resistive structures are framed by the at least two electrodes.

8. A temperature sensor according to claim 1, wherein the substrate is a metal oxide, the metal oxide being coated.

9. A temperature sensor according to claim 1, wherein the at least one of the one or more resistive structures is a meander-shaped linear structure, which is made of a metal.

10. A temperature sensor according to claim 9, wherein the metal is platinum.

11. A temperature sensor according to claim 1, wherein the at least one of the one or more resistive structures is covered with at least one dielectric layer.

12. A temperature sensor according to claim 11, wherein the at least one dielectric layer is selected from the group consisting of a ceramic layer, a glass layer, or a glass ceramic layer.

13. A method for producing a temperature sensor according to claim 1, in which at least one resistive structure is applied to a first side of a substrate, wherein a metallic coating, is applied to the substrate in such a way that the coating forms the at least one resistive structure, at least two terminal contacts and at least one electrode, so that the terminal contacts electrically contact the at least one resistive structure and electrically contact at least one electrode with at least one terminal contact.

14. A high temperature sensor chip, comprising a temperature sensor according to claim 1.

15. The high temperature sensor chip according to claim 14, wherein the terminal contacts of the temperature sensor are contacted with wires.

16. The high temperature sensor chip according to claim 14, wherein the at least one of the one or more resistive structures is covered directly and over the entire surface area with a ceramic intermediate layer or a glass ceramic or a glass layer (20).

* * * * *